United States Patent [19]

Enjoh

[11] Patent Number: 5,288,653
[45] Date of Patent: Feb. 22, 1994

[54] PROCESS OF FABRICATING AN INSULATED-GATE FIELD EFFECT TRANSISTOR

[75] Inventor: Hiroyasu Enjoh, Tokyo, Japan
[73] Assignee: NEC Corporation, Tokyo, Japan
[21] Appl. No.: 841,070
[22] Filed: Feb. 25, 1992
[30] Foreign Application Priority Data
  Feb. 27, 1991 [JP] Japan .................................. 3-053602
[51] Int. Cl.$^5$ .......................................... H01L 21/336
[52] U.S. Cl. ....................................... 437/41; 437/29; 437/40; 437/911; 148/DIG. 126
[58] Field of Search ................... 437/41, 911, 40, 29; 148/DIG. 126; 257/335

[56] References Cited

U.S. PATENT DOCUMENTS

| | | | |
|---|---|---|---|
| 4,680,853 | 7/1987 | Lidow et al. | 437/41 |
| 4,798,810 | 1/1989 | Blanchard et al. | 437/29 |
| 5,141,883 | 8/1992 | Ferla et al. | 437/40 |

OTHER PUBLICATIONS

Wolf, et al., Silicon Processing, vol. I, Process Technology, 1986, Lattice Press, pp. 302–309, 314–327.

*Primary Examiner*—T. N. Quach
*Attorney, Agent, or Firm*—Sughrue, Mion, Zinn, Macpeak & Seas

[57] ABSTRACT

A process of fabricating an insulated-gate field effect transistor includes step for forming a silicon gate electrode 5 on a gate insulation film 4 deposited over one surface of a p-type semiconductor substrate 10; forming n-type base regions 7 extending beneath the silicon gate electrode by introducing an n-type impurity into specified areas of the surface of the semiconductor substrate using the silicon gate electrode 5 as a mask, and then laterally diffusing the introduced impurity; forming a mask layer 8 on the silicon gate electrode; forming p-type source regions in the base regions 7 by introducing p-type impurity, with the silicon gate electrode 5 masked with the mask layer 8, into the specified areas of the surface of the semiconductor substrate, thereby portions in the base regions 7 beneath the silicon gate electrode 5 being defined as channel regions 12; forming a drain electrode 14 on the other surface of the semiconductor substrate 10. This process allows substantially only one impurity of the conductivity type (n-type in this case) to enter in the silicon gate electrode, thus contributing to making the resistance of this silicon gate electrode lower.

16 Claims, 5 Drawing Sheets

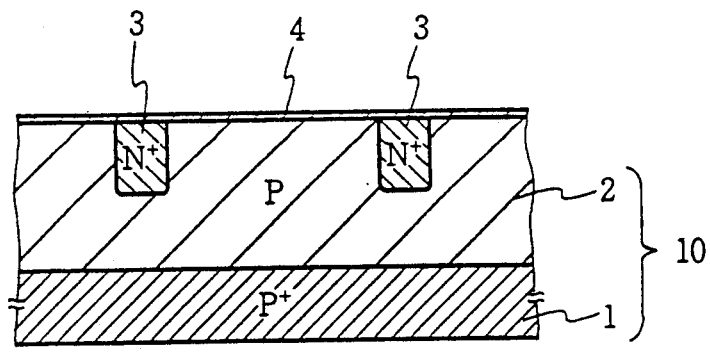
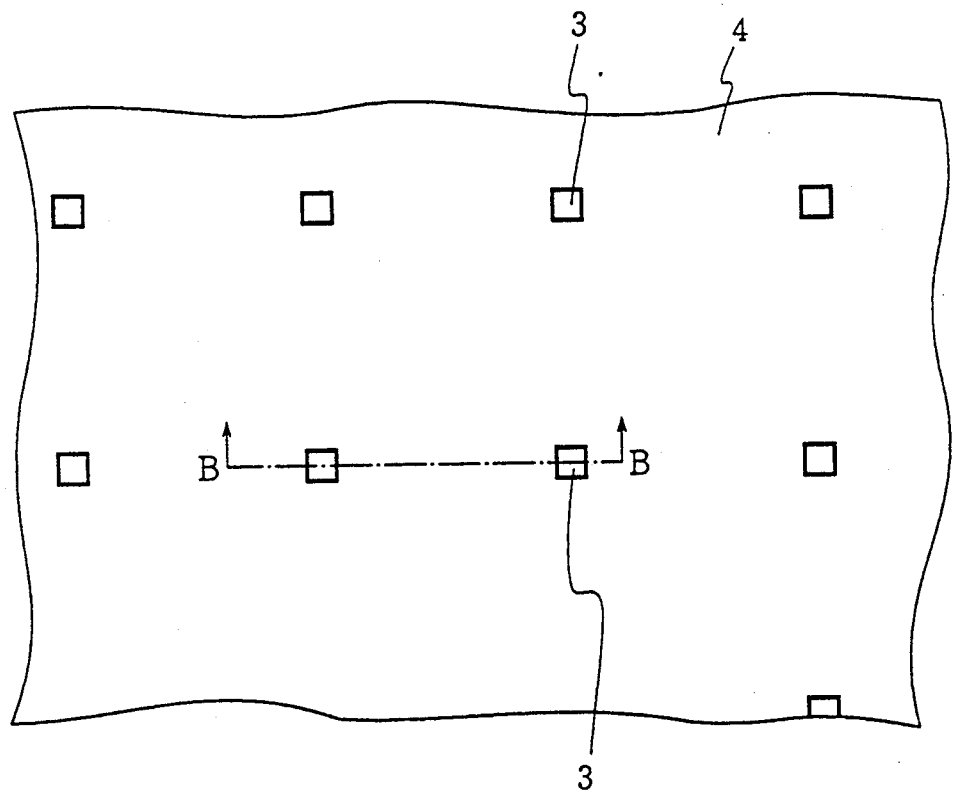

PROCESS OF FABRICATING AN INSULATED-GATE FIELD EFFECT TRANSISTOR

BACKGROUND OF THE INVENTION

1. Field of the Invention

This invention relates to a process of fabricating the insulated-gate field effect transistor (referred to as IGFET hereinafter), and more particularly to a process of fabricating a high power IGFET with a silicon gate electrode, and with a drain electrode formed on the undersurface of the semiconductor substrate.

2. Description of the Related Art

An IGFET which is constructed of source and channel regions at one surface, a silicon gate electrode on the surface, and a drain electrode on the other surface of a semiconductor substrate, thereby electric charges moving from the surface to the undersurface and being output from the drain electrode on it, is adapted for high breakdown voltage and high power application. Furthermore it is possible to form self-aligned channel regions of a prescribed short channel length using the silicon gate electrode as a part of diffusion mask by double diffusion technique involving introduction of p- and n-type impurities in sequence.

Such a process of fabricating the IGFET is disclosed, for example, in U.S. Pat. No. 4,953,302, which comprises forming p-type base regions by ion-implantation of boron atoms into an n-type semiconductor layer using exposed polycrystalline silicon gate electrode as a mask, followed by thermal treatment for annealing, and subsequently forming n-type source regions in those p-type base regions by thermal diffusion of phosphorus likewise using as a mask the polycrystalline silicon gate electrode left exposed, thereby channel regions being defined. This process can provide an n-channel type IGFET containing self-aligned channel regions formed in the p-type base regions at the substrate surface under the utilization of the difference in lateral diffusion between boron and phosphorus.

In the process described above, the polycrystalline silicon gate electrode, into which the p-type impurity is introduced during formation of the p-type base regions and the n-type impurity during formation of the n-type source regions, consequently both conductivity types of impurities counteracting against each other, results in creating an increased resistance. This produces a problem of increasing gate input resistance and in turn slowing down the switching speed of the IGFET.

SUMMARY OF THE INVENTION

It therefore is the principal object of the present invention to provide a process of fabricating an IGFET comprising forming channel regions self-aligned with respect to the silicon gate electrode and formed at the surface of a semiconductor substrate by double introduction of p- and n-type impurities in sequence into the surface of a semiconductor substrate, and permitting the resistance value of the silicon gate electrode to be low.

One novel feature of the present invention resides in a process of fabricating an insulated-gate field effect transistor comprising: forming a silicon gate electrode on a gate insulation film deposited over one surface of a semiconductor substrate of a first conductivity type such as p-type; forming base regions of a second conductivity type such as n-type opposite to the first conductivity type, extending beneath the silicon gate electrode by introducing an impurity of the second conductivity type into specified areas of the surface of the semiconductor substrate using the silicon gate electrode as a mask, followed by diffusion; forming a mask layer on the silicon gate electrode; forming source regions of the first conductivity type in the base regions by introducing an impurity of the first conductivity type, with the silicon gate electrode masked by the mask layer, into the specified areas of the surface of the semiconductor substrate, followed by diffusion, thereby portions in the base regions, extending beneath the silicon gate electrode being defined as channel regions; and forming a drain electrode on the other surface of the semiconductor substrate.

As described above, in the present invention, the source regions are formed substantially without introducing an impurity of the first conductivity type into the silicon gate electrode which hence can contain substantially only an impurity of the second conductivity type, as the matter of course there being no counteraction of p- and n-type impurities against each other, with the result of maintaining a low resistance value of this electrode.

Subsequently the base regions can be formed by ion implantation of the impurity of the second conductivity type into specified areas of the one surface of the semiconductor substrate, followed by the first thermal treatment, and the source regions can be formed by ion implantation of the impurity of the first conductivity type into the same areas, followed by the second thermal treatment. Preferable doses for forming the source regions are within a range of $1 \times 10^{15}$ to $1 \times 10^{16}/cm^2$ using p-type such as boron as an impurity of the first conductivity type, and are within $1 \times 10^{15}$ to $1 \times 10^{16}/cm^2$ using n-type such as phosphorus as an impurity of the second conductivity type. The mask layer, if it is of photoresist, is removed before the second thermal treatment. It is ideal to just superimpose the patterned mask layer over the whole silicon gate electrode pattern. It however is preferred, in order to, even if actually unavoidable misalignment occurred, avoid overlap of mask layer over the impurity-introduced areas of the semiconductor substrate and to mask as large part as possible, so that the window pattern of the mask layer formed is smaller than the window pattern of the silicon gate electrode by 1 to be 2 $\mu m$ between the corresponding respective edges of both window patterns.

BRIEF DESCRIPTION OF THE DRAWINGS

The above-mentioned and other objects, features and advantage of this invention will become more apparent by reference to the following detailed description of the invention taken in conjunction with the accompanying drawings, wherein:

FIGS. 1 through 7 are drawings illustrating a processing sequence for a preferred embodiment of the present invention;

FIG. 1A is a plan view illustrating the first processing step;

FIG. 1B is a cross-sectional view taken along line B—B in FIG. 1A when viewed in the direction of the arrows;

FIG. 4 is a cross-sectional view illustrating the fourth processing step;

FIG. 6 is a cross-sectional view illustrating the sixth step; and

FIG. 7 is a plan view diagramming schematically the whole of a semiconductor pellet in the processing step of FIG. 6.

DETAILED DESCRIPTION OF THE PREFERRED EMBODIMENTS

Figure 2B:
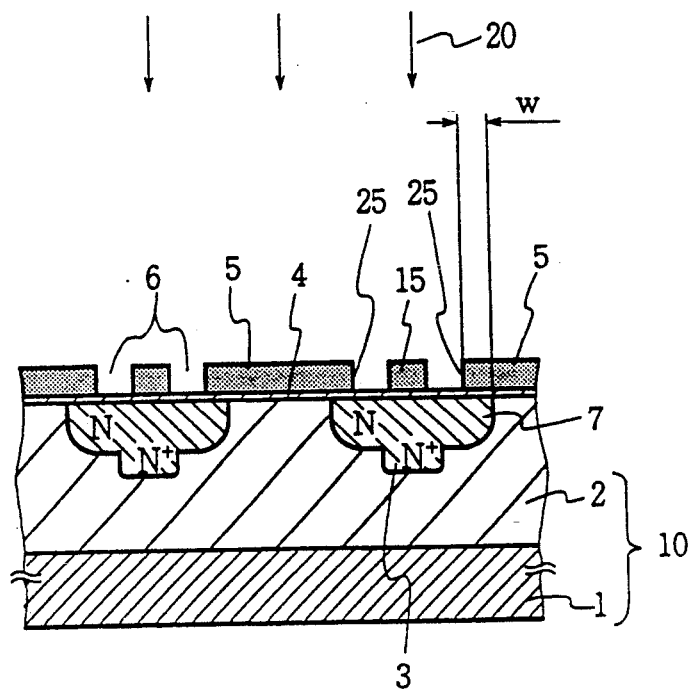
FIG. 2B is a cross-sectional view taken along line B—B in FIG. 2A when viewed in the direction of the arrows.

As an embodiment of the present invention, a process of fabricating an IGFET of about 40V in breakdown voltage between source and drain will be described with reference to the accompanying drawings hereinafter:

First, a p-type single crystal silicon layer 2 of $1.6 \times 10^{16}/cm^3$ is epitaxially grown to a thickness of 14 $\mu$m onto a P+-type silicon base 1 of $1 \times 10^{19}/cm^3$ in p-type impurity concentration and 270 $\mu$m thick to construct a desired semiconductor substrate structure 10. At the upper surface of the p-type single crystal silicon layer 2, that is, the top of semiconductor substrate 10, a matrix of n+-type regions 3 is formed by the selective ion implantation technique using a mask (not shown) at intervals of 25 $\mu$m. Each n+-type region is of a square of 5 $\mu$m×5 $\mu$m in plan, 4 $\mu$m thick, and $2 \times 10^{17}/cm^3$ in surface concentration of n-type impurity. The mask used for the formation of n+-type regions 3 is removed from the upper surface of semiconductor substrate 10, and, then, over this surface a 50 nm thick gate oxide film 4 is formed by thermal oxidation. (FIGS. 1A and 1B)

Figure 2A:
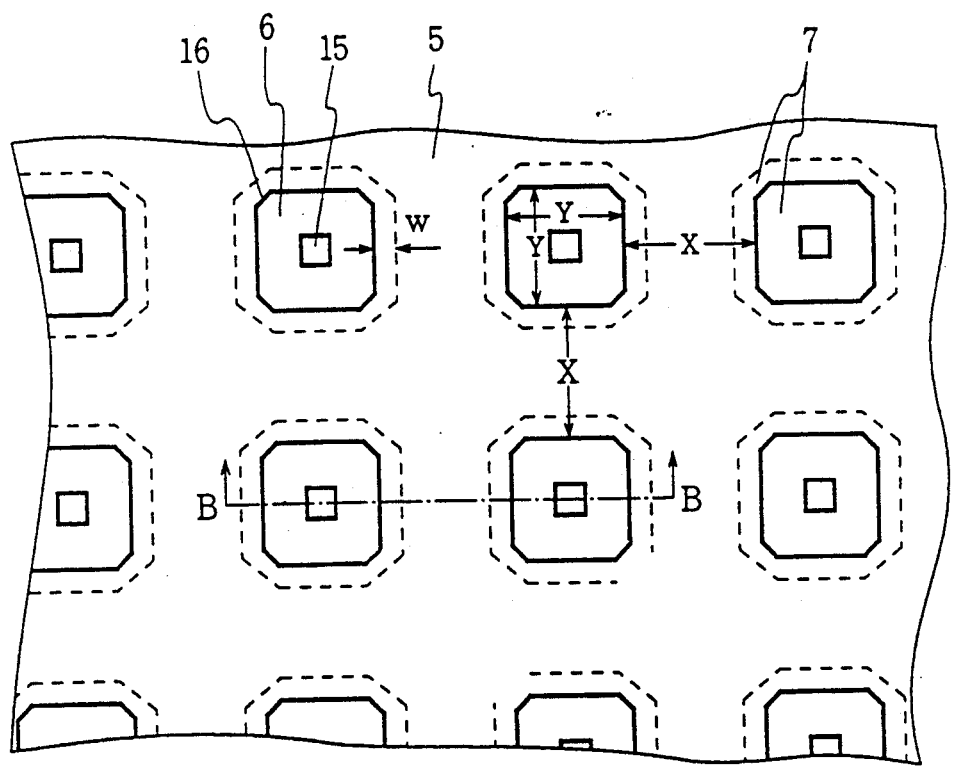
FIG. 2A is a plan view illustrating the second processing step.

In the next step for forming a gate electrode, undoped polycrystalline silicon film is deposited to a thickness of 600 nm, and then, phosphorus is diffused into this film to a phosphorus concentration of $1 \times 10^{20}/cm^3$ by thermal diffusion to reduce its specific resistance. Subsequently, this polycrystalline silicon film is selectively etched by photolithography to form a silicon gate electrode 5 provided with a number of windows 6 which are gridlike in plan. The so-called grid width or the distance X between opposite sides of adjacent windows 6 is 10 $\mu$m. There is an island 15 of polycrystalline silicon left at the center of each window. Thus each window has a ringlike configuration of which the outer shape is a square of 15×15 $\mu$m (distance Y between the opposite sides) with each corner chamfered for each side to be 3 $\mu$m shorter than Y. The island 15 of polycrystalline silicon film has a square plan of 15×15 $\mu$m and is located above the n+-type region 3. Thereafter, by ion implantation at an acceleration voltage of 80 keV using silicon gate electrode 5 and islands 15 as masks, phosphorus 20 is injected at a dose of $5.5 \times 10^{13}/cm^2$ through windows 6 into the surface of the semiconductor substrate, followed by thermal activation treatment at 1200° C. for 100 minutes for drive-in diffusion of phosphorus to form n-type base regions 7 connecting to n+regions 3 and extending beneath silicon gate electrode 5 by 2.5 $\mu$m from the edge 25 of window 6. In this processing step, silicon gate electrode 5 is exposed, and hence is implanted with phosphorus. The remaining p-type region of semiconductor substrate 10 excluding n-type base regions 7 and n+-type regions 3 functions as a drain region of IGFET (FIGS. 2A and 2B). Furthermore the silicon film may be made of amorphous silicon or, if desired, single crystalline silicon changed so, for example, by laser beam irradiation, instead of polycrystalline silicon.

Figure 3B:
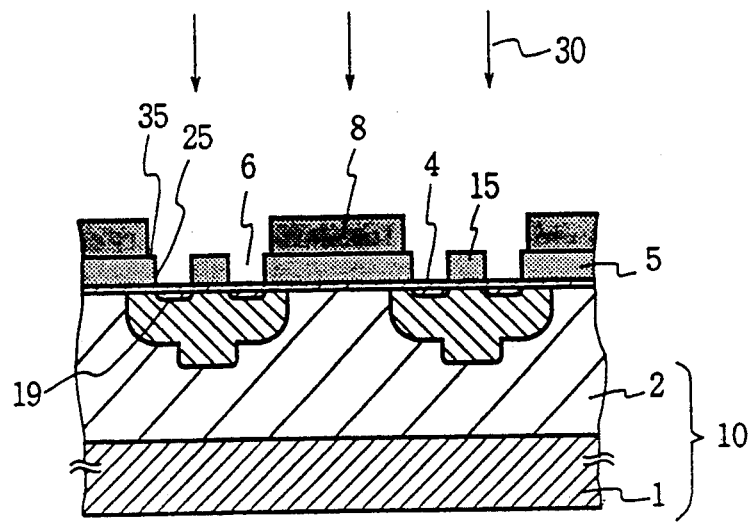
FIG. 3B is a cross-sectional view taken along line B—B in FIG. 3A when viewed in the direction of the arrows.
Figure 3A:
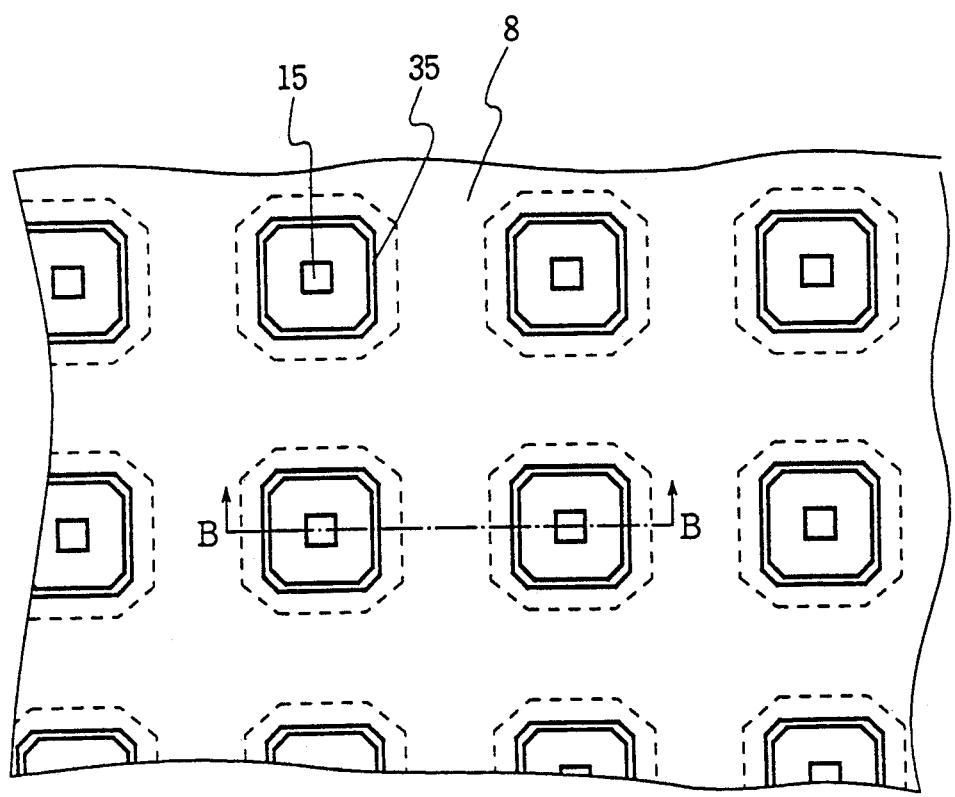
FIG. 3A is a plan view illustrating the third processing step.

In the next step, with photolithography, a patterned photoresist film 8 of 4 $\mu$m thick is formed only on silicon gate electrodes 5. The patterned photoresist film 8 is preferred to be designed with usual alignment precision to cover as large part of the silicon gate electrode 5 as possible without extending into the windows 6, that is, with annular exposed margins 35 each of 1 to 2 $\mu$m (1 $\mu$m in this embodiment) in width from the edge 25 of a window 6. Then, by ion implantation using the patterned resist film 8, annular exposed margins 35 and islands 15 of polycrystalline silicon film, boron 30 is injected through windows 6 at a dose of $5 \times 10^{15}/cm^2$ and at an acceleration voltage of 50 keV into the surface of the semiconductor substrate to form p+layer 19. In this ion implantation of boron, it is prevented from being injected into the major part of silicon gate electrode 5 excluding the annular exposed margins in virtue of being masked by the patterned resist film 8. (FIGS. 3A and 3B).

Figure 4:
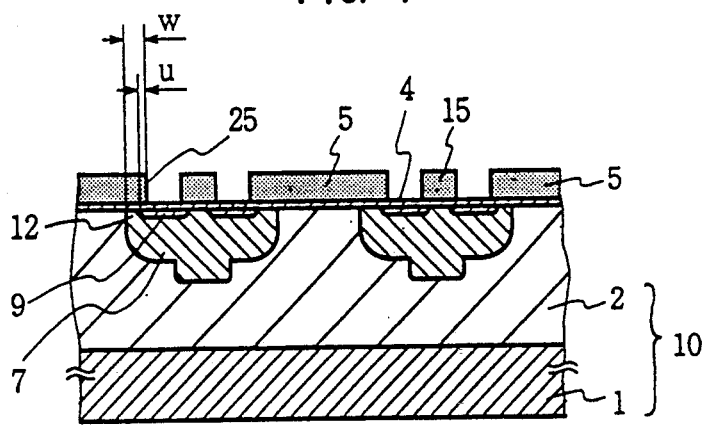
Figure 5B:
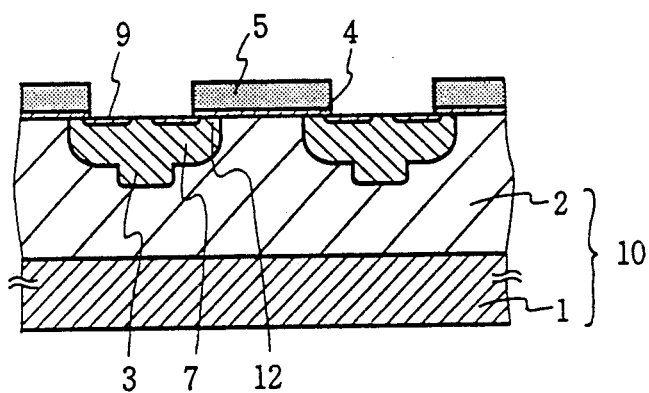
FIG. 5B is a cross-sectional view taken along line B—B in FIG. 5A when viewed in the direction of the arrows.
Figure 5A:
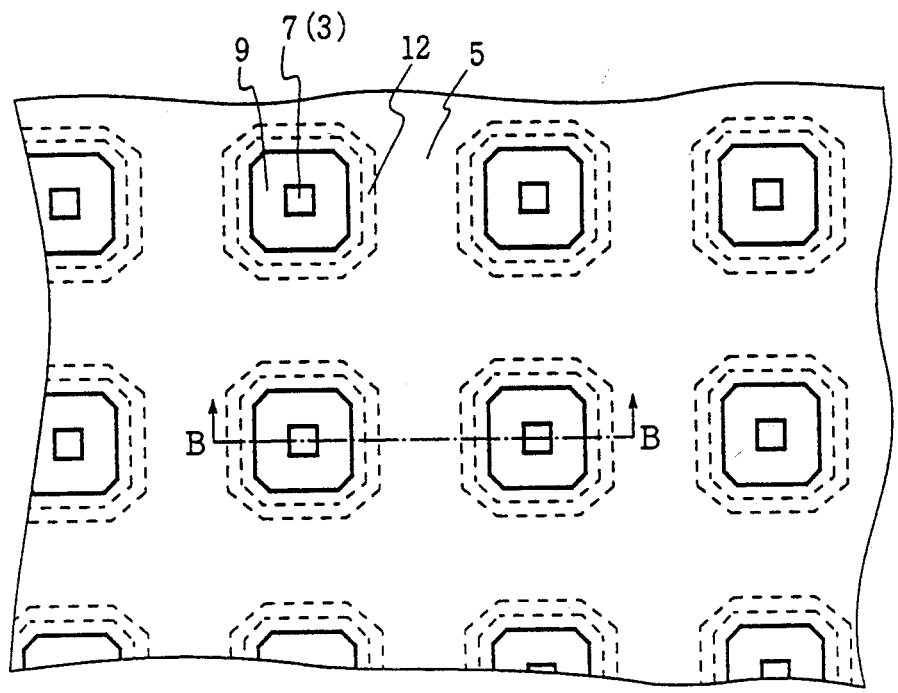
FIG. 5A is a plan view of the fifth processing step.

In the next step, the patterned resist film 8 is removed, and then thermal activation treatment is carried out at 1000° C. for 30 minutes for drive-in diffusion of boron of the p+layer 19 into n-type base region 7 by a distance of "u" (=1.0 $\mu$m) from the edge 25 in each window 6 beneath the electrode, thus p+-type source region 9 being formed (FIG. 4). Simultaneously, polycrystalline crystalline silicon film islands 15 and the parts of the gate oxide film 4 within windows 6 are removed. Thermal treatment in this processing step is carried out under the conditions of low temperature and short time compared with the drive-in diffusion of phosphorus in the preceding processing step, and hence the shape of the base region is defined by the preceding processing step, and the shape of the source region is defined by this process. Thus, n-type base regions 7 extends beneath silicon gate electrode 5 by the distance of 2.5 $\mu$m from the edge 25 in each window 6 and p+-type source region 9 extends beneath by 1.0 $\mu$m, therefore annular channel regions 12 of 1.5 $\mu$m wide being formed under the silicon gate electrode 5. (FIGS. 5A and 5B).

Figure 6:
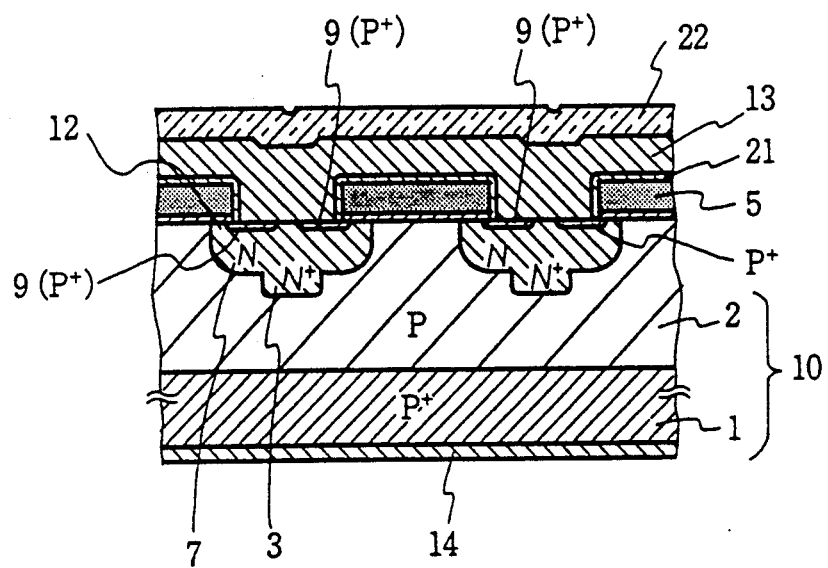

In the next processing step, phosphorus glass film 21 is formed, as an interlayer dielectric film, on a silicon gate electrode 5. A common source electrode 13 of aluminium is formed to be connected both to p+-type source regions 9 and to n+-type regions 3 serving as leads of n-type base regions 7 in each of which a channel region 12 is formed. Besides the whole is covered with a passivation film 22. On the under surface of p+-type silicon base 1 to be a part of the drain region, or on the under surface of semiconductor substrate 10, a drain electrode 14 of aluminum is formed. (FIG. 6)

Figure 7:
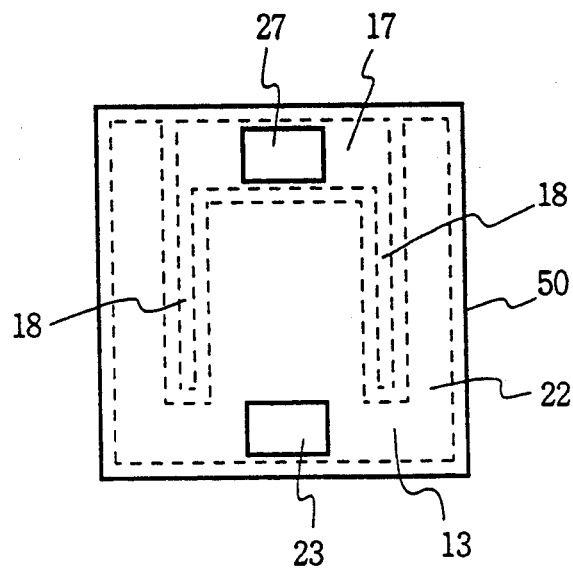

As shown in FIG. 7, in the passivation film 22 of the top layer of a 2.1 mm by 2.1 mm semiconductor pellet 50 is cut an opening through which a part of source electrode 13 is exposed and its bonding pad 23 is formed there. Additionally as an aluminum layer at the level of source electrode 13 is formed a gate lead electrode 17 which has a plurality of gate fingers 18 connecting to the grid-like silicon gate-electrode 5 through windows (not shown) formed in the interlayer dielectric film 21, and a bonding pad 27 extending therefrom through an opening cut in passivation film 22. Bonding pads 23, 27 and gate fingers 18 are formed on a thick insulating film (not shown).

The IGFET fabricated according to this embodiment has proved for its silicon gate electrode to have a sheet resistance of 20 Ω/square, and thus to have a good switching speed characteristics of rise time ($t_{on}$) 30 nS and decay time ($t_{off}$) 40 nS.

On the other hand an IGFET which is fabricated into the same configuration and under the same fabrication conditions as in this embodiment except the respect of performing ion implantation of a p-type impurity, boron, without forming a patterned resist film 8 in the processing step of FIGS. 3A and 3B, hence to allow boron to enter into the silicon gate electrode, resulting in the coexistence of n- and p-type impurities in there, has proved for its silicon gate electrode to have a sheet resistance of 30 Ω/square, and thus to exhibit a slow switching speed characteristics of rise time ($t_{on}$) 50 nS and decay time ($t_{off}$) 70 nS.

The present invention, which can be applied to the n-channel type IGFET as well as to the p-channel type IGFET as illustrated in this embodiment, is notably effective on the p-channel type IGFET containing p-type source regions requiring ion implantation at a high dose because there is a tendency that the p-channel type IGFET has a higher gate-electrode resistance than that of the n-channel type IGFET of which the source regions are of n-type. Besides the same effect by the application of the present invention as in the above-described embodiment has been demonstrated also in the process of fabricating an IGFET in which using a silicon gate electrode having a phosphorus concentration of $10^{19}/cm^3$ or more and a film thickness of 200 nm to 1000 nm base regions are formed by ion implantation of phosphorus at doses ranging from $1 \times 10^{13}$ to $1 \times 2$ and source regions are formed by ion implantation of boron at doses ranging from $1 \times 10^{15}$ to $10^{16}/cm^2$.

Although the invention has been described with reference to a specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments within the true scope of the invention.

What is claimed is:

1. A process of fabricating an insulated-gate field effect transistor comprising the steps of:

forming a polycrystalline silicon layer on a gate insulating film covering one main surface of a semiconductor substrate of a first conductivity;

selectively removing said polycrystalline silicon layer to form a silicon gate electrode having a plurality of holes and a plurality of silicon islands each located in an associated one of said holes;

selectively introducing an impurity of a second conductivity type opposite to said first conductivity type into said semiconductor substrate by using said silicon gate electrode and said silicon islands as a mask to thereby form a plurality of base regions of said second conductivity type in said semiconductor substrate;

forming a mask layer on said silicon gate electrode;

selectively introducing an impurity of said first conductivity type into each of said base regions, using said silicon gate electrode an said silicon islands as a mask, and preventing said second impurity from being introduced into said silicon gate electrode via said mask layer to thereby form a plurality of source regions of said first conductivity type in said base regions, respectively, each of said source regions having a ring shape;

removing each of said silicon islands and said mask layer;

forming a source electrode in contact with respective parts of said base regions and said source regions; and forming a drain electrode on an opposite main surface of said semiconductor substrate.

2. A process of fabricating an insulated-gate field effect transistor according to claim 17, wherein said impurity of said second conductivity type is introduced by ion implantation into said semiconductor substrate and then diffused by the first thermal treatment, and said impurity of said first conductivity type is introduced by ion implantation into each of said base regions and then diffused by the second thermal treatment.

3. A process of fabricating an insulated-gate field effect transistor according to claim 2 wherein said mask layer is a photoresist layer and removed before said second thermal treatment.

4. A process of fabricating an insulated-gate field effect transistor according to claim 1 wherein said first conductivity type is p-type, said second conductivity type is n-type, and said transistor is p-type.

5. A process of fabricating an insulated-gate field effect transistor according to claim 3 wherein the dose of said p-type impurity by way of ion implantation is within the range of from $1 \times 10^{15}$ to $1 \times 10^{16}/cm^2$ and the dose of said n-type impurity by way of ion implantation is within the range of from $1 \times 10^{13}$ to $1 \times 10^{14}/cm^2$.

6. A process of fabricating an insulated-gate field effect transistor according to claim 3 wherein said p-type impurity is boron, and said n-type impurity is phosphorus.

7. A process of fabricating an insulated-gate field effect transistor according to claim 17 wherein said semiconductor substrate is constructed of a silicon base of said first conductivity type and a silicon epitaxial layer of said first conductivity type over said silicon base, said silicon base being higher in impurity concentration than said silicon epitaxial layer; and said one main surface of said semiconductor substrate is the upper surface of said silicon epitaxial layer and said opposite main surface of said semiconductor substrate is the undersurface of said silicon base.

8. A process of fabricating an insulated-gate field effect transistor comprising the steps of:

forming a silicon gate electrode on a gate insulating film deposited over one surface of a semiconductor substrate of a first conductivity type;

forming base regions of a second conductivity type opposite to said first conductivity type, extending beneath said silicon gate electrode by introducing an impurity of said second conductivity type into specified areas of said surface of said semiconductor substrate using said a silicon gate electrode as a mask, and then diffusing said introduced impurity;

forming a mask layer on said silicon gate electrode;

forming source regions of said first conductivity type in said base regions by introducing an impurity of said first conductivity type, with said silicon gate electrode masked with said mask layer, into said specified areas of said surface of said semiconductor substrate, and then diffusing said introduced impurity, thereby portions in said base regions, extending beneath said silicon gate electrode being defined as channel regions; and forming a drain electrode on the other surface of said semiconductor substrate;

wherein the window pattern of said mask layer is formed to be smaller than the window pattern of said silicon gate electrode by 1 to 2 $\mu$m between the corresponding respective edges of both window patterns.

9. A process of fabricating an insulated-gate field effect transistor comprising the steps of:

forming a gate insulating film on one main surface of a semiconductor substrate of a first conductivity type having a plurality of impurity regions of a second conductivity type selectively formed therein;

forming a polycrystalline silicon layer on said gate insulating film;

selectively removing said polycrystalline silicon layer to form a silicon gate electrode having a plurality of holes and a plurality of silicon islands located in an associated one of said holes, each of said silicon islands being formed on a part of said gate insulating film covering an associated one of said impurity regions;

introducing an impurity of said second conductivity type into said semiconductor substrate by ion implantation of said impurity of said second conductivity type with using said silicon gate electrode and said silicon islands as a mask;

performing activation treatment to make said impurity of said second conductivity type diffuse laterally and reach an associated one of said impurity regions to thereby form a plurality of base regions in said semiconductor substrate;

forming a mask layer on said silicon gate electrode;

introducing an impurity of a said first conductivity type into each of said base regions by ion implantation of said impurity of said first conductivity type with using said mask layer and said silicon islands as a mask, said impurity of said first conductivity type being prevented from being introduced into said gate electrode by said mask layer;

performing activation treatment to activate said impurity of said first conductivity type to thereby form a plurality of source regions in said base region, respectively, each of said source regions having a ring shape;

removing said mask layer and each of said silicon islands;

forming a source electrode in contact with respective parts of said base regions and said source regions; and forming a drain electrode on an opposite main surface of said semiconductor substrate.

10. A process of fabricating an insulated-gate field effect transistor according to claim 9 wherein activation treatment of said impurity of said second conductivity type is the first thermal treatment, and activation treatment of said impurity of said first conductivity type is the second thermal treatment.

11. A process of fabricating an insulated-gate field effect transistor according to claim 9 wherein said first conductivity type is p-type, said second conductivity type is n-type, and said transistor is of p-type.

12. A process of fabricating an insulated-gate field effect transistor according to claim 11 wherein the dose of said p-type impurity introduced as within the range of from $1 \times 10^{15}$ to $1 \times 10^{16}$/cm$^2$ and the dose of said n-type impurity introduced is within the range of from $1 \times 10^{13}$ to $1 \times 10^{14}$/cm$^2$.

13. A process of fabricating an insulated-gate field effect transistor according to claim 11 wherein said p-type impurity is boron, and said n-type impurity is phosphorus.

14. A process of fabricating an insulated-gate field effect transistor according to claim 9 wherein said semiconductor substrate consists of a silicon base of said first conductivity type and a silicon epitaxial layer of said first conductivity type grown over the uppersurface of said silicon base, said silicon base being higher in impurity concentration than said silicon epitaxial layer; and said one main surface of said semiconductor substrate is the uppersurface of said silicon epitaxial layer and said opposite main surface of said semiconductor substrate is the undersurface of said silicon base.

15. A process of fabricating an insulated-gate field effect transistor according to claim 9 wherein said mask layer is a photoresist layer.

16. A process of fabricating an insulated-gate field effect transistor comprising the steps of:

forming a polycrystalline silicon film on a gate insulating film deposited over a semiconductor substrate of a first conductivity type;

shaping a grid-like silicon gate electrode by patterning said polycrystalline silicon film;

introducing an impurity of a second conductivity type opposite to said first conductivity type by ion implantation of said impurity of said second conductivity type into a specified areas of said surface of said semiconductor substrate and said silicon gate electrode using said silicon gate electrode as a mask;

forming base regions of said second conductivity type extending beneath said silicon gate electrode by subjecting said impurity of said second conductivity type introduced in said semiconductor substrate by ion implantation to activation treatment to be laterally diffused;

forming a mask layer on said silicon gate electrode;

introducing an impurity of said first conductivity type, with said silicon gate electrode masked with said mask layer, into said specified areas of said surface of said semiconductor substrate by ion implantation;

removing said mask layer;

forming source regions of said first conductivity type in said base regions by subjecting said impurity of said first conductivity type injected by ion implantation to activation treatment, thereby surface portions of said base regions beneath said silicon gate electrode being defined as channel regions;

forming a source electrode connecting to said source regions on the side of said one surface of said semiconductor substrate; and forming a drain electrode on the other surface of said semiconductor substrate;

wherein the window pattern of said mask layer is formed to be smaller than the window pattern of said silicon gate electrode by 1 $\mu$m to 2 $\mu$m between the corresponding respective edges of both window patterns.

* * * * *

UNITED STATES PATENT AND TRADEMARK OFFICE
CERTIFICATE OF CORRECTION

PATENT NO. : 5,288,653
DATED : February 22, 1994
INVENTOR(S) : Hiroyasu ENJOH It is certified that error appears in the above-identified patent and that said Letters Patent is hereby corrected as shown below:

Column 1, line 27, change "4,953,302 to --4,593,302--.

Column 3, line 58, change "15 x 15 $\mu$m" to --5 x 5 $\mu$m--.

Column 4, line 44, change "extends" to --extend--.

line 47, after "beneath" insert --edge 25--.

Column 5, line 39, change "1 x 2" and insert --1 x $10^{14}$/cm$^2$--.

Signed and Sealed this

Nineteenth Day of July, 1994

*Attest:*

BRUCE LEHMAN

*Attesting Officer*     *Commissioner of Patents and Trademarks*